(12) United States Patent
Clausen et al.

(10) Patent No.: US 9,214,932 B2
(45) Date of Patent: Dec. 15, 2015

(54) BODY-BIASED SWITCHING DEVICE

(71) Applicant: TRIQUINT SEMICONDUCTOR, INC., Hillsboro, OR (US)

(72) Inventors: William J. Clausen, Altamonte Springs, FL (US); James P. Furino, Jr., Melbourne, FL (US); Michael D. Yore, Orlando, FL (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 138 days.

(21) Appl. No.: 13/764,655

(22) Filed: Feb. 11, 2013

(65) Prior Publication Data

US 2014/0227983 A1  Aug. 14, 2014

(51) Int. Cl.
*H01L 29/00* (2006.01)
*H03K 17/06* (2006.01)
*H03K 17/16* (2006.01)
*H01L 29/78* (2006.01)

(52) U.S. Cl.
CPC .............. *H03K 17/063* (2013.01); *H01L 29/78* (2013.01); *H03K 17/162* (2013.01); *H03K 2017/066* (2013.01); *H03K 2217/0018* (2013.01)

(58) Field of Classification Search
CPC .................................................... H03K 17/063
USPC ....................................................... 455/78, 83
See application file for complete search history.

(56) References Cited

U.S. PATENT DOCUMENTS

| | | |
|---|---|---|
| 3,551,788 A | 12/1970 | Summer |
| 3,699,359 A | 10/1972 | Shelby |
| 4,053,916 A | 10/1977 | Cricchi et al. |
| 4,316,101 A | 2/1982 | Minner |
| 4,491,750 A | 1/1985 | Janutka |
| 5,012,123 A | 4/1991 | Ayasli et al. |
| 5,146,178 A | 9/1992 | Nojima et al. |
| 5,313,083 A | 5/1994 | Schindler |
| 5,416,043 A | 5/1995 | Burgener et al. |
| 5,492,857 A | 2/1996 | Reedy et al. |
| 5,548,239 A | 8/1996 | Kohama |
| 5,553,295 A | 9/1996 | Pantelakis et al. |
| 5,572,040 A | 11/1996 | Reedy et al. |
| 5,596,205 A | 1/1997 | Reedy et al. |
| 5,600,169 A | 2/1997 | Burgener et al. |
| 5,663,570 A | 9/1997 | Reedy et al. |
| 5,777,530 A | 7/1998 | Nakatuka |

(Continued)

FOREIGN PATENT DOCUMENTS

| | | |
|---|---|---|
| CN | 1256521 | 6/2000 |
| EP | 0385641 | 9/1990 |

(Continued)

OTHER PUBLICATIONS

Non-Final Office Action in U.S. Appl. No. 13/772,277 dated Sep. 24, 2014.

(Continued)

*Primary Examiner* — Wen Huang
(74) *Attorney, Agent, or Firm* — Withrow & Terranova, P.L.L.C.

(57) ABSTRACT

Embodiments provide a switching device including one or more field-effect transistors (FETs). In embodiments, a body-bias circuit may derive a bias voltage based on a radio frequency signal applied to a switch field-effect transistor and apply the bias voltage to the body terminal of the switch field-effect transistor.

20 Claims, 9 Drawing Sheets

(56) References Cited

U.S. PATENT DOCUMENTS

| | | | |
|---|---|---|---|
| 5,801,577 A | 9/1998 | Tailliet | |
| 5,818,099 A * | 10/1998 | Burghartz | 257/548 |
| 5,861,336 A | 1/1999 | Reedy et al. | |
| 5,863,823 A | 1/1999 | Burgener | |
| 5,883,396 A | 3/1999 | Reedy et al. | |
| 5,895,957 A | 4/1999 | Reedy et al. | |
| 5,920,233 A | 7/1999 | Denny | |
| 5,930,638 A | 7/1999 | Reedy et al. | |
| 5,945,867 A | 8/1999 | Uda et al. | |
| 5,973,363 A | 10/1999 | Staab et al. | |
| 5,973,382 A | 10/1999 | Burgener et al. | |
| 6,057,555 A | 5/2000 | Reedy et al. | |
| 6,066,993 A | 5/2000 | Yamamoto et al. | |
| 6,100,159 A | 8/2000 | Krivokapic | |
| 6,111,455 A | 8/2000 | Eleyan et al. | |
| 6,160,292 A | 12/2000 | Flaker et al. | |
| 6,173,235 B1 | 1/2001 | Maeda | |
| 6,225,667 B1 | 5/2001 | Buynoski et al. | |
| 6,229,187 B1 | 5/2001 | Ju | |
| 6,249,027 B1 | 6/2001 | Burr | |
| 6,288,613 B1 | 9/2001 | Bennett | |
| 6,308,047 B1 | 10/2001 | Yamamoto et al. | |
| 6,376,286 B1 | 4/2002 | Ju | |
| 6,417,030 B1 | 7/2002 | Buynoski et al. | |
| 6,452,232 B1 | 9/2002 | Adan | |
| 6,503,783 B1 | 1/2003 | Mouli | |
| 6,504,212 B1 | 1/2003 | Allen et al. | |
| 6,563,366 B1 | 5/2003 | Kohama | |
| 6,631,505 B2 | 10/2003 | Arai | |
| 6,632,724 B2 | 10/2003 | Henley et al. | |
| 6,635,928 B2 | 10/2003 | Mouli | |
| RE38,319 E | 11/2003 | Lin et al. | |
| 6,642,578 B1 | 11/2003 | Arnold et al. | |
| 6,693,326 B2 | 2/2004 | Adan | |
| 6,716,682 B1 | 4/2004 | Mouli | |
| 6,785,703 B2 | 8/2004 | Bradley et al. | |
| 6,790,747 B2 | 9/2004 | Henley et al. | |
| 6,804,502 B2 | 10/2004 | Burgener et al. | |
| 6,898,778 B2 | 5/2005 | Kawanaka | |
| 6,905,918 B2 | 6/2005 | Mouli | |
| 6,908,832 B2 | 6/2005 | Farrens et al. | |
| 6,924,673 B2 | 8/2005 | Tanishima | |
| 6,930,357 B2 | 8/2005 | Kang | |
| 6,958,519 B2 | 10/2005 | Gonzalez et al. | |
| 6,969,668 B1 | 11/2005 | Kang et al. | |
| 6,978,437 B1 | 12/2005 | Rittman et al. | |
| 6,989,706 B2 | 1/2006 | Sekigawa et al. | |
| 7,056,808 B2 | 6/2006 | Henley et al. | |
| 7,057,472 B2 | 6/2006 | Fukamachi et al. | |
| 7,058,922 B2 | 6/2006 | Kawanaka | |
| 7,122,411 B2 | 10/2006 | Mouli | |
| 7,123,898 B2 | 10/2006 | Burgener et al. | |
| 7,138,846 B2 | 11/2006 | Suwa | |
| 7,158,067 B2 | 1/2007 | Lauritzen et al. | |
| 7,244,991 B2 | 7/2007 | Ohsawa | |
| 7,404,157 B2 | 7/2008 | Tanabe | |
| 7,460,852 B2 | 12/2008 | Burgener et al. | |
| 7,566,600 B2 | 7/2009 | Mouli | |
| 7,616,482 B2 | 11/2009 | Prall | |
| 7,796,969 B2 | 9/2010 | Kelly et al. | |
| 7,860,499 B2 | 12/2010 | Burgener et al. | |
| 7,863,691 B2 | 1/2011 | Wagner, Jr. et al. | |
| 7,890,891 B2 | 2/2011 | Stuber et al. | |
| 7,910,993 B2 | 3/2011 | Brindle et al. | |
| 8,129,787 B2 | 3/2012 | Brindle et al. | |
| 8,159,283 B2 | 4/2012 | Sugiyama | |
| 8,385,845 B1 | 2/2013 | Cortese | |
| 8,395,435 B2 * | 3/2013 | Cassia et al. | 327/436 |
| 8,723,260 B1 * | 5/2014 | Carroll et al. | 257/347 |
| 8,847,672 B2 | 9/2014 | Prabhakar, III et al. | |
| 8,886,136 B1 | 11/2014 | Signoff et al. | |
| 2001/0015461 A1 | 8/2001 | Ebina | |
| 2001/0045602 A1 | 11/2001 | Maeda et al. | |
| 2002/0195623 A1 | 12/2002 | Horiuchi | |
| 2003/0002452 A1 | 1/2003 | Sahota | |
| 2003/0205760 A1 | 11/2003 | Kawanaka et al. | |
| 2004/0080364 A1 | 4/2004 | Sander et al. | |
| 2005/0167751 A1 | 8/2005 | Nakajima et al. | |
| 2006/0022733 A1 | 2/2006 | Nair | |
| 2006/0044043 A1 | 3/2006 | Marshall | |
| 2007/0023833 A1 | 2/2007 | Okhonin et al. | |
| 2007/0138549 A1 | 6/2007 | Wu et al. | |
| 2008/0073719 A1 | 3/2008 | Fazan et al. | |
| 2008/0076371 A1 | 3/2008 | Dribinsky et al. | |
| 2008/0303080 A1 | 12/2008 | Bhattacharyya | |
| 2009/0029511 A1 | 1/2009 | Wu | |
| 2010/0013016 A1 | 1/2010 | Shih | |
| 2011/0090022 A1 | 4/2011 | Villain | |
| 2011/0227637 A1 | 9/2011 | Stuber et al. | |
| 2011/0260774 A1 * | 10/2011 | Granger-Jones et al. | 327/427 |
| 2011/0285481 A1 * | 11/2011 | Huang et al. | 333/81 R |
| 2012/0154963 A1 | 6/2012 | Deval et al. | |
| 2012/0169398 A1 | 7/2012 | Brindle et al. | |
| 2012/0267719 A1 | 10/2012 | Brindle et al. | |
| 2013/0029614 A1 | 1/2013 | Cho | |
| 2013/0100561 A1 | 4/2013 | Senouci et al. | |
| 2013/0252562 A1 | 9/2013 | Hasson et al. | |
| 2014/0002171 A1 | 1/2014 | Nohra | |
| 2014/0009214 A1 | 1/2014 | Altunkilic | |
| 2014/0227983 A1 | 8/2014 | Clausen | |

FOREIGN PATENT DOCUMENTS

| | | |
|---|---|---|
| EP | 1006584 | 6/2000 |
| EP | 1451890 | 2/2011 |
| JP | 5575348 | 6/1980 |
| JP | 01254014 | 10/1989 |
| JP | 02161769 | 6/1990 |
| JP | 04183008 | 6/1992 |
| JP | 06334506 | 12/1994 |
| JP | 08148949 | 6/1996 |
| JP | 08307305 | 11/1996 |
| JP | 09284114 | 10/1997 |
| JP | 10242829 | 9/1998 |
| JP | 11136111 | 5/1999 |
| JP | 2003060451 | 2/2003 |
| JP | 3408762 | 5/2003 |
| JP | 2003189248 | 7/2003 |
| JP | 2004515937 | 5/2004 |
| WO | 9523460 | 8/1995 |
| WO | 0227920 | 4/2002 |
| WO | 2007008934 | 1/2007 |
| WO | 2007035610 | 3/2007 |

OTHER PUBLICATIONS

Office Action, issued in U.S. Appl. No. 13/742,086, dated Sep. 20, 2013, 9 pages.

Notice of Allowance in U.S. Appl. No. 13/587,590 dated Jan. 7, 2014.

Assaderaghi, et al.; "Dynamic Threshold-Voltage MOSFET (DTMOS) for Ultra-Low Voltage VLSI;" IEEE. vol. 44; No. 3; 414-421; Mar. 1997.

Bolam, R. et al., "Reliability Issues for Silicon-on-Insulator," Electron Devices Meeting Technical Digest, 2000, pp. 131-134.

Burgener, et al.; "CMOS SOS Switches Offer Useful Features, High Integration;" Microwaves & RF; 107-118; Aug. 2001.

Caverly, R. et al., "A Silicon CMOS Monolithic RF and Microwave Switching Element," 27th European Microwave Conference, Sep. 1997, pp. 1046-1051.

Caverly; "Linear and Nonlinear Characteristics of the Silicon CMOS Monolithic 50-$\Omega$ Microwave and RF Control Element;" IEEE. vol. 34; No. 1; 124-126; Jan. 1999.

Celler, et al.; "Smart Cut—A guide to the technology, the process, the products;" http://www.soitec.com/pdf/SmartCut_WP.pdf; Jul. 2003.

Chao, et al.; "High-Voltage and High-Temperature Applications of DTMOS with Reverse Schottky Barrier on Substrate Conctacts;" IEEE Electron Device Letters; vol. 25; No. 2; Feb. 2004; pp. 86-88.

Chung, I. et al., "SOI MOSFET Structure with a Junction-Type Body Contact for Suppression of Pass Gate Leakage," IEEE Transactions on Electron Devices, Jul. 2001, pp. 1360-1365, vol. 48, No. 7.

(56) References Cited

OTHER PUBLICATIONS

Dean; "Transistors, Theory and Circuitry." McGraw-Hill Publ. Co. Ltdl; 90-93; 1964.
Drake, et al.; "Dynamic-Threshold Logic for Low-Power VLSI Design." http://www.research.ibm.com/acas/projects/01drake.pdf; 2003.
Edwards, et al.; "The Effect of Body Contact Series Resistance on SOI CMOS Amplifier Stages;" IEEE Transactions on Electron Devices; vol. 44; No. 12; Dec. 1997; pp. 2290-2294.
Hameau, F. et al., "Radio-Frequency Circuits Integration Using CMOS SOI 0.25μm Technology," 2002 RF IC Design Workshop Europe, Mar. 19-22, 2002, 6 pages.
Hess et al.; "Transformerless Capacitive Coupling of Gate Signals for Series Operation of Power MOS Devices;" IEEE; vol. 15; No. 5; Sep. 2000.
Hirano, Y. et al., "Impact of Actively Body-bias Controlled (ABC) SOI SRAM by using Direct Body Contact Technology for Low-Voltage Application," Electron Devices Meeting Technical Digest, 2003, pp. 2.4.1-2.4.4.
Hu, C. et al., "A Unified Gate Oxide Reliability Model," IEEE 37th Annual International Reliability Physics Symposium, 1999, pp. 47-51.
Huang et al.; "A 0.5-μm CMOS T/R Switch for 900-MHz Wireless Applications;" IEEE Journal of Solid-State Circuits; vol. 36; No. 3; Mar. 2001.
Iyama, et al.; "L-Band SPDT Switch Using Si-MOSFET;" The Institute of Electronics, Information and Communication Engineers (IEICE); 636-643; 1996.
Johnson, et al.; "Advanced Thin-Film Silicon-on-Sapphire Technology: Microwave Circuit Applications," IEEE; vol. 45; No. 5; May 1998.
Kuang, J. et al., "A floating-body charge monitoring technique for partially depleted SOI technology," Int. J. Electronics, Nov. 2004, pp. 625-637, vol. 91, No. 11.
Kuang, J. et al., "SRAM Bitline Circuits on PD SOI: Advantages and Concerns," IEEE Journal of Solid-State Circuits, Jun. 1997, pp. 837-844, vol. 32, No. 6.
Kuo, et al.; "Low-Voltage SOI CMOS VLSI Devices and Circuits;" Wiley Interscience, New York, XP001090589, pp. 57-60 and pp. 349-354; 2001.
Lauterbach, et al.; "Charge Sharing Concept and New Clocking Scheme for Power Efficiency and Electromagnetic Emission Improvement of Boosted Charge Pumps;" IEEE Journal of Solid-State Circuits; vol. 35; No. 5; pp. 719-723; May 2000.
Lee et al., "Effects of Gate Structures on the RF Performance in PD SOI MOSFETs," IEEE Microwave and Wireless Components Letters, Apr. 2005, pp. 223-225, vol. 15, No. 4.
Lee, et al.; "Effect of Body Structure on Analog Performance of SOI NMOSFETs;" Proceedings; 1998 IEEE International SOI Conference; Oct. 5-8, 1998; pp. 61-62.
Lee, H. et al., "Analysis of body bias effect with PD-SOI for analog and RF applications," Solid State Electronics, 2002, pp. 1169-1176, vol. 46.
Lee, H. et al., "Harmonic Distortion due to Narrow Width Effects in Deep sub-micron SOI-CMOS Device for analog-RF applications," 2002 IEEE International SOI Conference, Oct. 2002, pp. 83-85.
Li, et al.; "A 15-GHz Integrated CMOS Switch with 21.5-dBm IP1dB and 1.8-dB Insertion Loss;" IEEE; 2004 Symposium on VLSI Circuits; Digest of Technical Papers; Jun. 17-19, 2004.

Maeda, et al.; "Substrate-Bias Effect and Source-Drain Breakdown Characteristics in Body-Tied Short-Channel SOI MOSFET's;" IEEE Transactions on Electron Devices; vol. 46; No. 1; Jan. 1999; pp. 151-158.
Makioka, S. et al., "Super Self-Aligned GaAs RF Switch IC with 0.25 dB Extremely Low Insertion Loss for Mobile Communication Systems," IEEE Transactions on Electron Devices, Aug. 2001, pp. 1510-1514, vol. 48, No. 8.
Megahed, M. et al, "Low Cost UTSI Technology for RF Wireless Applications," IEEE MTT-S Digest, 1998, pp. 981-984.
Orndorff, et al.; "CMOS/SOS/LSI Switching Regulator Control Device;" Solid-State Circuits Conf.; Digest of Technical Papers; IEEE International; vol. XXI; pp. 234-235; Feb. 1978.
Phillips Semiconductors; "Single Pole Double Throw (SPDT) Switch, RF Communication Products;" IC17 Handbook; 1997.
Rodgers, P. et al., "Silicon UTSi CMOS RFIC for CDMA Wireless Communications Systems," IEEE MTT-S Digest, 1999, pp. 485-488.
Rozeau, O. et al., "SOI Technologies for Low-Power Low-Voltage Radio-Frequency Applications," Analog Integrated Circuits and Signal Processing, 2000, pp. 93-114, vol. 25.
Sedra, A. et al., Microelectronic Circuits, 1998, Fourth Edition, University of Toronto Press, Oxford University Press, pp. 374-375.
Sleight, J. et al., "Transient Measurements of SOI Body Contact Effectiveness," IEEE Electron Device Letters, Dec. 1998, pp. 499-501, vol. 19, No. 12.
Suehle et al., "Low Electric Field Breakdown of Thin Si02 Films Under Static and Dynamic Stress," IEEE Transactions on Electron Devices, May 1997, pp. 801-808, vol. 44, No. 5.
Tinella, et al.; "A High-Performance CMOS-SOI Antenna Switch for the 2.5 5-GHz Band;" IEEE Journal of Solid-State Circuits; vol. 38; No. 7; Jul. 2003.
Wei, et al.; "Measurement of Transient Effects in SOI DRAM/SRAM Access Transistors;" IEEE Electron Device Letters; vol. 17; No. 5; May 1996.
Workman, et al.; "A Comparative Analysis of the Dynamic Behavior of BTG/SOI MOSFET's and Circuits with Distributed Body Resistance;" IEEE Transactions on Electron Devices; vol. 45; No. 10; Oct. 1998; pp. 2138-2145.
Yamamoto, et al.; A 2.2-V Operation, 2.4-GHz Single-Chip GaAs MMIC Transceiver for Wireless Applications; IEEE; vol. 34; No. 4; Apr. 1999.
Final Office Action in U.S. Appl. No. 13/742,086, dated Mar. 4, 2014.
Office Action, issued in U.S. Appl. No. 13/587,590, dated Sep. 9, 2013, 12 pages.
Non-Final Office Action in U.S. Appl. No. 13/774,928 dated Jan. 6, 2015.
Notice of Allowance and Interview Summary for U.S. Appl. No. 13/742,086, mailed Jun. 24, 2014, 11 pages.
Notice of Allowance for U.S. Appl. No. 13/774,928, mailed Apr. 24, 2015, 7 pages.
Notice of Allowance for U.S. Appl. No. 13/774,928, mailed Jul. 31, 2015, 7 pages.
Non-Final Office Action for U.S. Appl. No. 14/174,727, mailed Aug. 27, 2015, 8 pages.
Notice before Examination for Israeli Application Patent No. 230314, mailed Oct. 25, 2015, 6 pages.
Notice before Examination for Israeli Application Patent No. 230677, mailed Nov. 9, 2015, 6 pages.

* cited by examiner

BODY-BIASED SWITCHING DEVICE

FIELD

Embodiments of the present disclosure relate generally to the field of circuits, and more particularly to a body-biased switching device utilizing a field-effect transistor ("FET").

BACKGROUND

For silicon-on-insulator ("SOI") switching devices, a negative body bias connection is used to alleviate floating body effects during off-mode operation. Present designs require the use of a charge pump to supply the negative voltage directly to the body. The circuit elements used to employ such a design may be associated with substrate noise coupling, increased number of control lines to a decoder circuit, spurious signals entering a radio frequency ("RF") switch core (due to restriction of available routing paths), and larger die size.

BRIEF DESCRIPTION OF THE DRAWINGS

Embodiments are illustrated by way of example and not by way of limitation in the figures of the accompanying drawings, in which like references indicate similar elements.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Embodiments may include a circuit, employed in a switching device, including a field effect transistor ("FET"). The FET may comprise a body, source, drain and gate with respective terminals coupled with each. The switching device may be a silicon-on-insulator ("SOI") switching device. The circuit may also include a body-bias circuit that includes a pair of circuit elements and is configured to derive a bias voltage based on a radio frequency ("RF") signal applied to the FET and provide the bias voltage to a body terminal of the FET when the FET is off. In some embodiments, the derived bias voltage may be a negative bias voltage. Various embodiments will be described in further detail below with reference to the figures.

Figure 1:
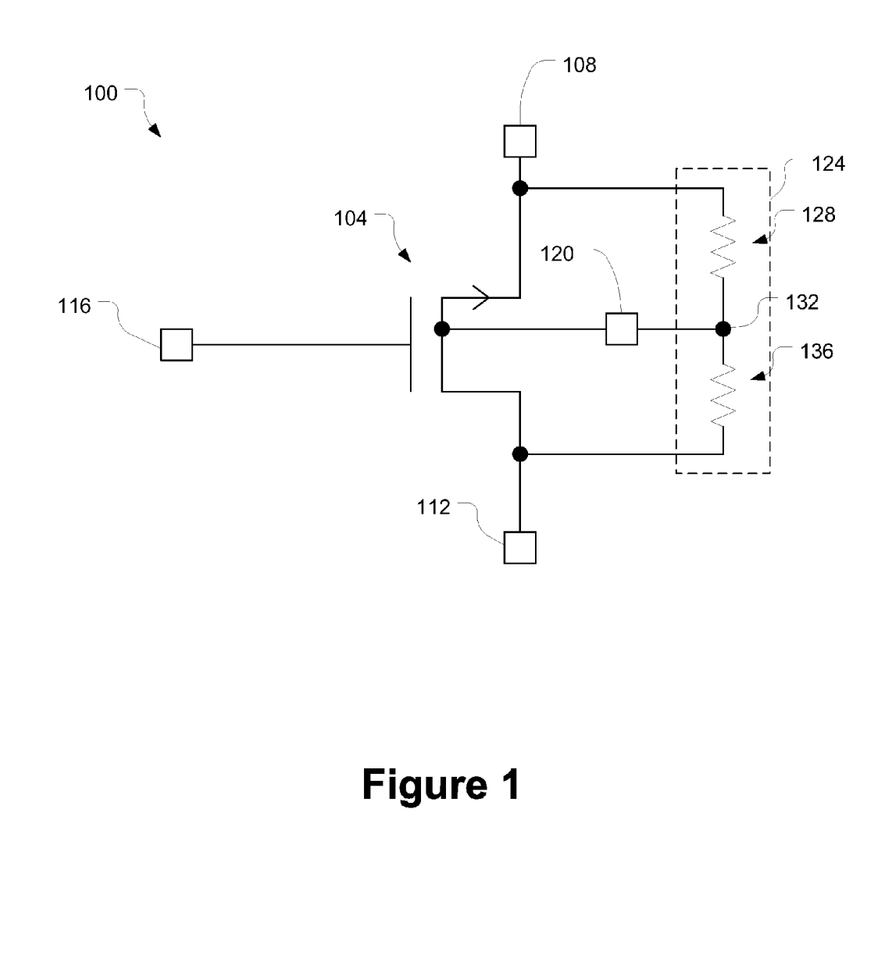
FIG. 1 illustrates a unit cell in accordance with some embodiments.

FIG. 1 illustrates a circuit 100 in accordance with various embodiments. Circuit 100 may also be referred to as a unit cell 100, or simply cell 100. Cell 100 may include a FET 104, which may also be referred to as switch FET 104. The FET 104 may be, and is generally shown as, an n-type field effect transistor ("nFET"). The FET 104 may include a source terminal 108, a drain terminal 112, a gate terminal 116, and a body terminal 120 coupled with a respective drain, source, gate, and body of the FET, as described below with reference to FIG. 2.

The cell 100 may further include a body-bias circuit 124. The body-bias circuit 124 may be coupled with the source terminal 108, the drain terminal 112 and the body terminal 120 of the FET 104. The body-bias circuit 124 may be used to provide an appropriate bias voltage to the base of the FET 104 as will be described below. In various embodiments, the body-bias circuit 124 will only be coupled with the three terminals of the FET 104. That is, no external connection or control lines need to be coupled with the bias-control circuit 124.

The body-bias circuit 124 may include a first resistor 128, a node 132, and a second resistor 136. The first resistor 128 may be coupled with and between the source terminal 108 and the node 132. The second resistor 136 may be coupled with and between the drain terminal 112 and the node 132. The node 132 may be coupled with the body terminal 120. The resistors 128, 136 may be of equal size.

The FET 104 may be an enhancement mode or a depletion mode FET. In some embodiments the FET 104 may be a metal-oxide-semiconductor FET ("MOSFET") while in other embodiments the FET 104 may be referred to as an insulated-gate FET ("IGFET") or a metal-insulator-semiconductor FET ("MISFET").

Various embodiments provide a body-biasing scheme to be used in biasing the voltage of the body of the FET 104. The biasing scheme is discussed herein with reference to an nFET. However, in other embodiments, the biasing scheme may be used with another type of FET, such as a p-type FET.

In various embodiments, the FET 104 may selectively transition between an off state and an on state to facilitate switching of a transmission signal, hereafter referred to as a radio frequency ("RF") signal. For example, the FET 104 may pass the RF signal between the source terminal 108 and the drain terminal 112 if the FET 104 is in the on state, and the FET 104 may prevent the passage of the RF signal between the drain terminal 112 and the source terminal 108 if the FET 104 is in the off state.

The FET 104 may receive a control signal at the gate terminal 116 to transition the FET 104 between the off state and the on state. For example, a DC voltage of +2.5 V with respect to the DC voltage of the drain terminal 112 and the source terminal 108—also referred to as gate-to-source voltage—may be applied to the gate terminal 116. In some embodiments, the voltage may be applied by a decoder (not shown in FIG. 1). The +2.5 V may have the effect of setting the FET 104 in the on state by causing the resistance between the drain terminal 112 and the source terminal 108 to become very low so that an RF signal can pass between the drain terminal 112 and the source terminal 108.

Figure 2:
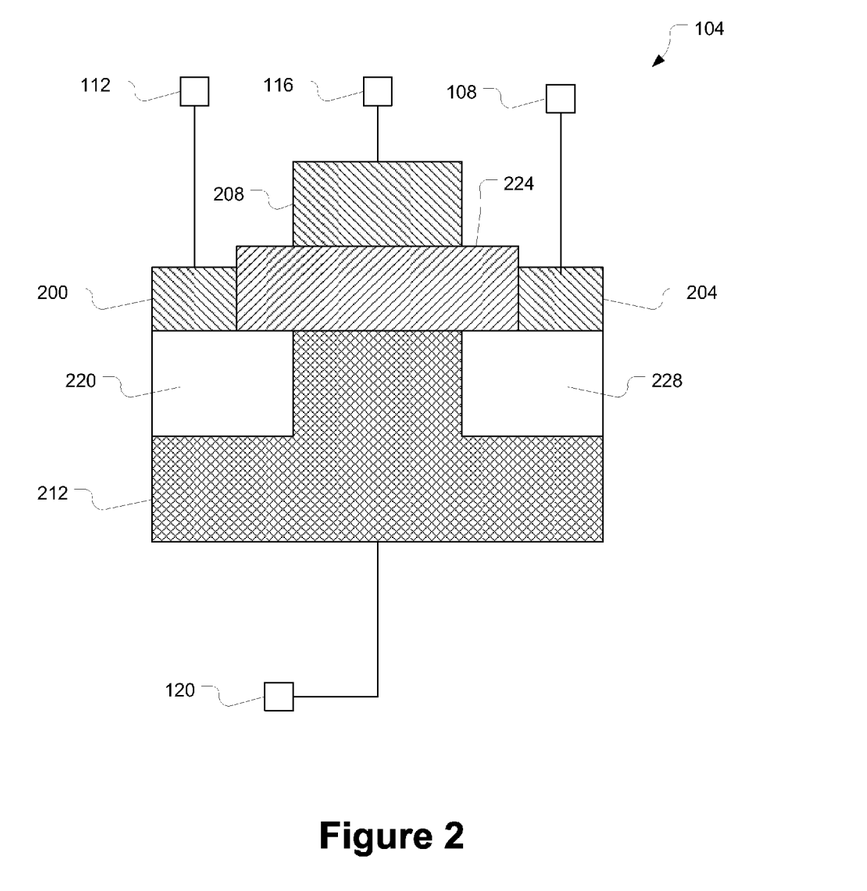
FIG. 2 illustrates a schematic of a switch transistor in accordance with some embodiments.

The application of a positive gate-to-source voltage may allow the RF signal to flow through the FET 104 because the FET 104, when included in an SOI switching device, may generally comprise parts as shown in FIG. 2. The FET 104 may be comprised of a drain 200 connected to the drain terminal 112, a source 204 connected to the source terminal 108, and a gate 208 connected to the gate terminal 116. In embodiments, the drain 200, the source 204, and the gate 208 may all be comprised of a metal or conductive material, for example, aluminum or copper. In embodiments the drain 200, source 204, and gate 208 may be comprised of the same material, or different materials.

The FET 104 may further comprise a body 212 connected to the body terminal 120. The FET 104 may further comprise an n-type drain portion 220 positioned between the drain 200 and the body 212, and an n-type source portion 228 positioned between the source 204 and the body 212, as will be described in further detail below.

As used herein, a terminal is an element of the FET 104 where the FET 104 connects to another element in a circuit. In some embodiments the drain 200 and the drain terminal 112 may be considered to be the same element, for example, the FET 104 may connect to another element in a circuit via a direct connection between the drain 200 and the element in the circuit. In other embodiments the drain terminal 112 may be a terminal, for example, a conductive lead, which is electrically coupled with the drain 200. For example, in these other embodiments, the FET 104 may connect with another element in the circuit via the drain terminal 112 which may be a metallic lead such as a copper or other conductive lead, which in turn may be coupled with the drain 200. Similarly, the source 204 and source terminal 108 may be the same as one another, or electrically coupled with one another, as described above with respect to the drain 200 and drain terminal 112. Similarly the gate 208 and the gate terminal 116 may be the same as one another, or electrically coupled with one another. Finally, the body 212 and the body terminal 120 may be the same as one another or coupled with one another. As used herein, the names given to the elements are for the purpose of distinguishing one element of the FET 104 from another, and different embodiments may use different names, for example, calling the n-type drain portion 220 the drain or the n-type source portion 228 the source of the FET 104.

As an example of use of the FET 104, a DC voltage will be discussed as being applied to the gate terminal 116, which in turn may cause the gate 208 to gain the specified voltage. However, in some embodiments the DC voltage may be applied directly to the gate 208. As another example, the RF signal may be received at either the source 204 or the source terminal 108 (or the drain 200 or the drain terminal 112), and passed through the FET 104 when the FET 104 is in an on state, to the drain 200 or drain terminal 112 (or the source 204 or the source terminal 108).

The body 212 may be made up of a p-type material, for example, a Group IV element such as silicon or germanium doped with Group III elements such as boron or aluminum. The n-type drain and source portions 220, 228, may be comprised of a Group IV element such as silicon or germanium doped with a Group V element such as arsenic or phosphorous. The n-type drain and source portions 220, 228 may be separated from one another by the body 212. In general, a p-type material is lacking electrons and is said to have electron holes. An n-type material has extra electrons which may be able to move as an electric current within or out of the n-type material, and may therefore be said to have mobile electrons.

As noted above, the gate 208 of the FET 104 may be comprised of a conductive metal such as copper or aluminum. In other embodiments, the gate 208 may be comprised of tantalum, tungsten or tantalum nitride. In other embodiments, the gate 208 of the FET 104 may be comprised of a polysilicon material. The drain 200, source 204, gate 208, and body 212 may all be separated from one another by a dielectric 224, for example silicon dioxide, silicon oxynitride, or some other high-k dielectric that prevents the flow of electrons between the drain 200 and the source 204.

To turn on the FET 104, an electrostatic field may be created between the gate 208 and the rest of the FET 104. This may be done by the decoder applying a positive voltage, for example, 2.5 V, to the gate 208. The drain 200 and source 204 may have a DC-bias voltage of, for example, 0 V. The body 212 may float resulting in a DC-bias voltage of, for example, approximately 0 V, with a low modulation power level provided by an RF signal transmitted through the FET 104.

The positive gate-to-source voltage may repel the electron holes in the p-type material of the body 212 while attracting the free electrons in the p-type material of the body 212. At the same time, the positive gate-to-source voltage may attract the mobile electrons in the n-type drain and source portions 220, 228. When the positive voltage of the gate 208 becomes high enough compared to the DC voltage of the drain 200 and the source 204, a voltage known as a threshold voltage, the repulsion in the p-type material of the body 212, and the attraction of the free electrons in the body 212 and the mobile electrons in the n-type drain and source portions 220, 228, may create an electric channel. The electric channel is sometimes called an inversion layer, and may be between the n-type drain and source portions 220, 228 and directly under the dielectric 224. In other words, the electric channel between the n-type drain and source portions 220, 228 may be directly between the body 212 and the dielectric 224. In some embodiments, increasing the voltage applied to the gate 208 may increase the size of the electrostatic field. The increase in the electrostatic field may increase the size of the electric channel, and thus the amount of current that can be passed between the drain 200 and the source 204.

To turn the FET 104 off, the decoder may apply a voltage of −2.5 V to the gate 208. The drain 200 and source 204 may remain DC biased at 0 V. However, the body 212 may be modulated with energy from the RF signal through the first resistor 128 and the second resistor 136. This provision of the body-bias voltage, which may be approximately 0 V, may be done entirely by a biasing voltage derived from the RF signal and does not require an extra control line from a decoder.

Figure 3:
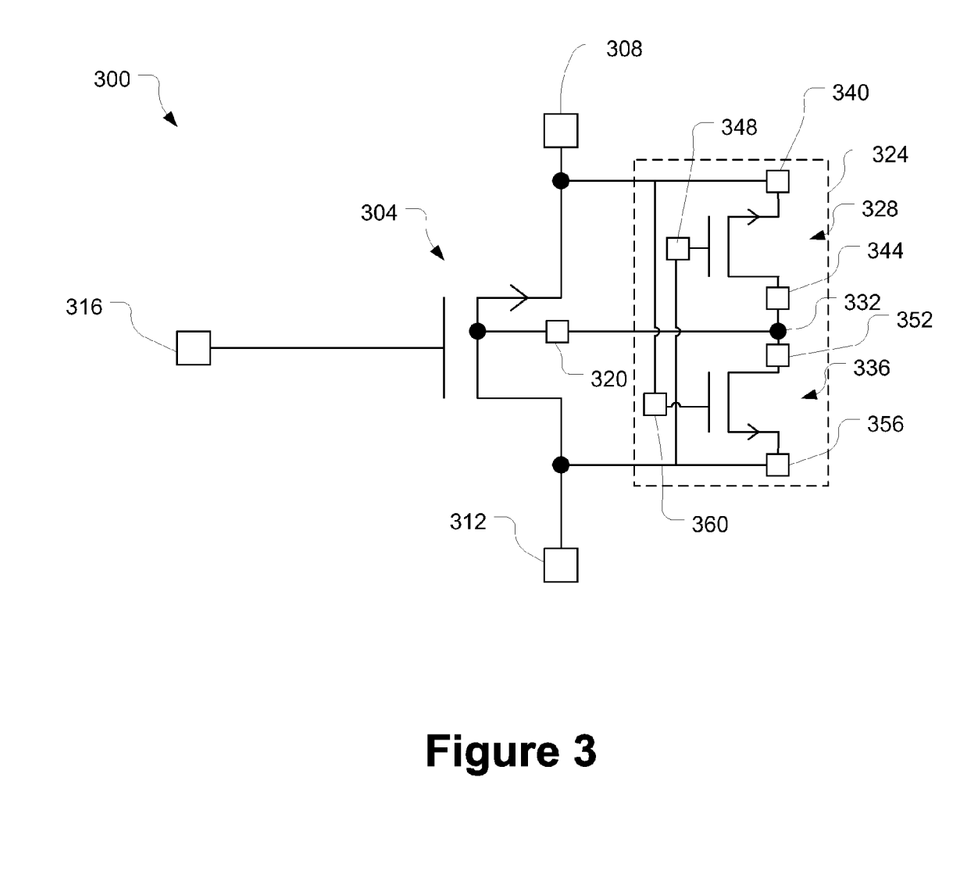
FIG. 3 illustrates a unit cell in accordance with other embodiments.

FIG. 3 illustrates a cell 300 in accordance with various embodiments. The cell 300 may be similar to cell 100 with like-named elements being substantially interchangeable.

The cell 300 may include a switch FET 304 having a source terminal 308, a drain terminal 312, and a gate terminal 316. The cell 300 may further include a body-bias circuit 324 that includes a first biasing FET 328, a node 332 coupled with the body terminal 320, and a second biasing FET 336. The biasing FETs 328, 336 may be generally referred to as describe as nFETs. However, other embodiments may utilize other types of FETs, such as pFETs.

The first biasing FET 328 may include a source terminal 340 coupled with source terminal 308, drain terminal 344 coupled with node 332, and gate terminal 348 coupled with drain terminal 312. The second biasing FET 336 may include a drain terminal 352 coupled with the node 332, a source terminal 356 coupled with drain terminal 312, and a gate terminal 360 coupled with source terminal 308.

Figure 4A:
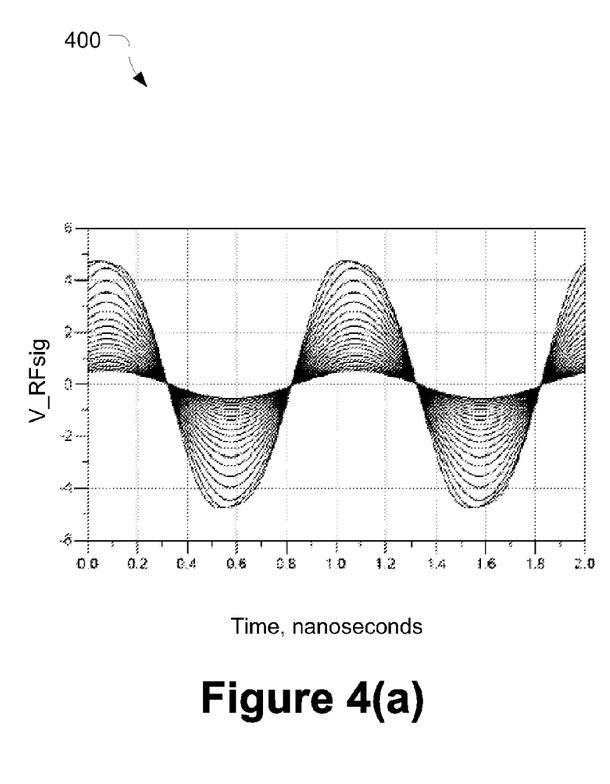
FIGS. 4(a) and 4(b) illustrate graphs of voltage over time in accordance with some embodiments.
Figure 4B:
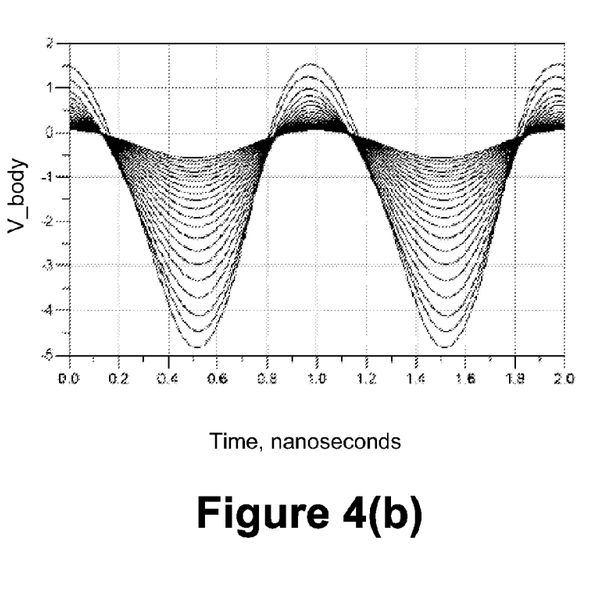

When the switch FET 304 is in an off state, the body bias circuit 324 may generate a negative voltage to bias the body based on an RF signal applied to the switch FET 304. This may be done as a result of the tying of the gates of the biasing FETs 328, 336 to the opposite source and drain terminals of the switch FET 304 as shown. Configuring the biasing FETs 328, 336 in this manner may work to limit, or clip, the positive voltage of the RF signal and amplify the negative voltage of the RF signal, resulting in a negative bias voltage applied to the body terminal 320. This may be seen in charts of FIG. 4, which plot a number of RF signals, at different power levels, as a function of time and voltage. In particular, FIG. 4(a) plots voltages of RF signals applied to the switch FET 304 over time and FIG. 4(b) plots the corresponding voltages applied to the body of the switch FET 304 by the body-bias circuit 324 over time.

Applying a negative bias voltage to the body as done by cell 300 may improve the performance of the cell 300. This may be due to the negative source-to-body voltage, in conjunction with the negative gate-to-source voltage, creating a negative electrostatic field that provides a high resistance between the drain terminal 312 and the source terminal 308. This is due to the negative electrostatic field simultaneously attracting the electron holes in the p-type body and repelling the mobile electrons in the n-type drain and source portions, thereby inhibiting transfer of electrons between the source and the drain. In other embodiments where a pFET is used instead of an nFET, the body may be an n-type material and the drain and source portions may be p-type material.

Providing the negative electrostatic field, as described above, may fully deplete the channel between the source and drain of the switch FET 304. This could limit a modulation effect of large RF signals that could otherwise occur when the switch FET 304 is in the off state and only has a partially-depleted channel. If the channel were only partially depleted, the switch FET 304 would be acting as lateral parasitic bipolar junction transistor with a portion of the partially-depleted channel serving as the P section of the NPN junction.

Figure 5:
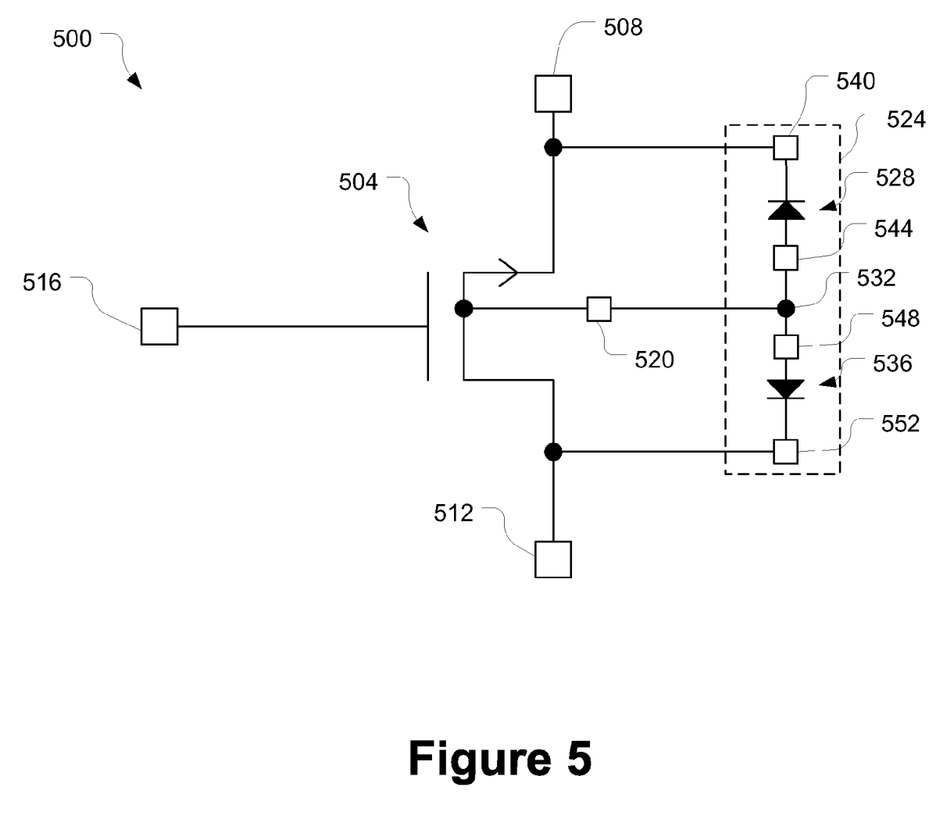
FIG. 5 illustrates a unit cell in accordance with other embodiments.

FIG. 5 illustrates a cell 500 in accordance with various embodiments. The cell 500 may be similar to cells 100 or 300 with like-named elements being substantially interchangeable.

The cell 500 may include a FET 504 having a source terminal 508, a drain terminal 512, a gate terminal 516, and a body terminal 520. The cell 500 may further include a body-bias circuit 524 that includes a first biasing diode 528, a node 532 coupled with the body terminal 520, and a second biasing diode 536.

The first biasing diode 528 may include a diode terminal 540 coupled with source terminal 508; and a cathode terminal 544 coupled with the node 532. The second biasing diode 536 may include an anode terminal 548 coupled with the node 532; and a cathode terminal 552 coupled with drain terminal 512.

When the FET 504 is in an on state, the biasing diodes 528, 536 will not conduct and the body will float. The body may generally stay around 0 V when floating. When the FET 504 is in an off state, the biasing diodes 528, 536 may rectify the RF signal to a DC signal to drive the body of the switch FET 504 from floating to an average negative voltage, which depends on a peak voltage of the RF signal across the switch FET 504. The waveforms of the voltage applied to the body may be similar to those shown in FIG. 4(b).

Figure 6:
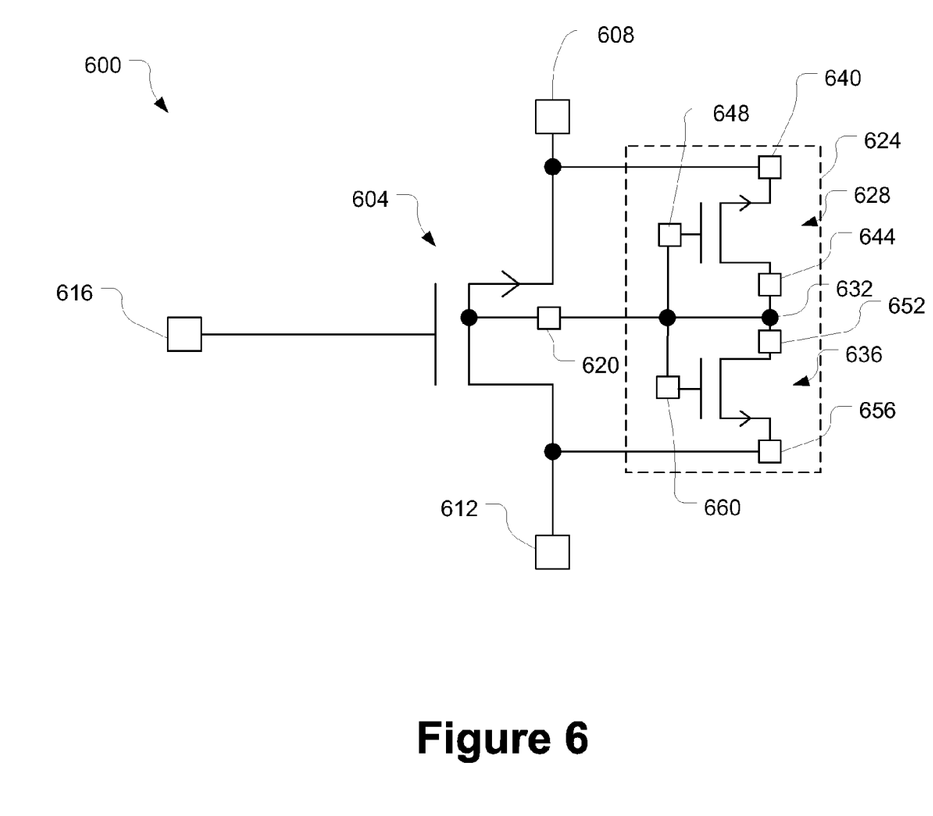
FIG. 6 illustrates a unit cell in accordance with other embodiments.

FIG. 6 illustrates a cell 600 in accordance with various embodiments. The cell 600 may be similar to cells 100, 300, or 500 with like-named elements being substantially interchangeable.

The cell 600 may include a FET 604, also referred to as switch FET 604, having a source terminal 608, a drain terminal 612, a gate terminal 616, and a body terminal 620. The cell 600 may further include a body-bias circuit 624 that includes a first biasing FET 628, a node 632 coupled with the body terminal 620, and a second biasing FET 636. The biasing FETs 628, 636 may be nFETs. Although other embodiments may use other types of FETs, such as pFETs.

The first biasing FET 628 may include a source terminal 640 coupled with source terminal 608; drain terminal 644 coupled with node 632; and a gate terminal 648 coupled with the node 632. The second biasing FET 636 may include a drain terminal 652 coupled with the node 632; a source terminal 656 coupled with drain terminal 612, and a gate terminal 660 coupled with the node 632. In this manner, the biasing FETs 628, 636 may be diode-connected FETs disposed between the drain and source of the switch FET 604, with a midpoint of the body-bias circuit 624 coupled with the body of the switch FET 604.

The diode-connected FETs 628, 636 may operate similar to the biasing diodes discussed above with respect to FIG. 5. However, the diode-connected FETs may have a turn-on voltage that is lower than a turn-on voltage of the biasing diodes, for example by 0.2 or 0.3 V. This may result in a more negative voltage being applied to the body when the switch FET 604 is in an off state.

Figure 7:
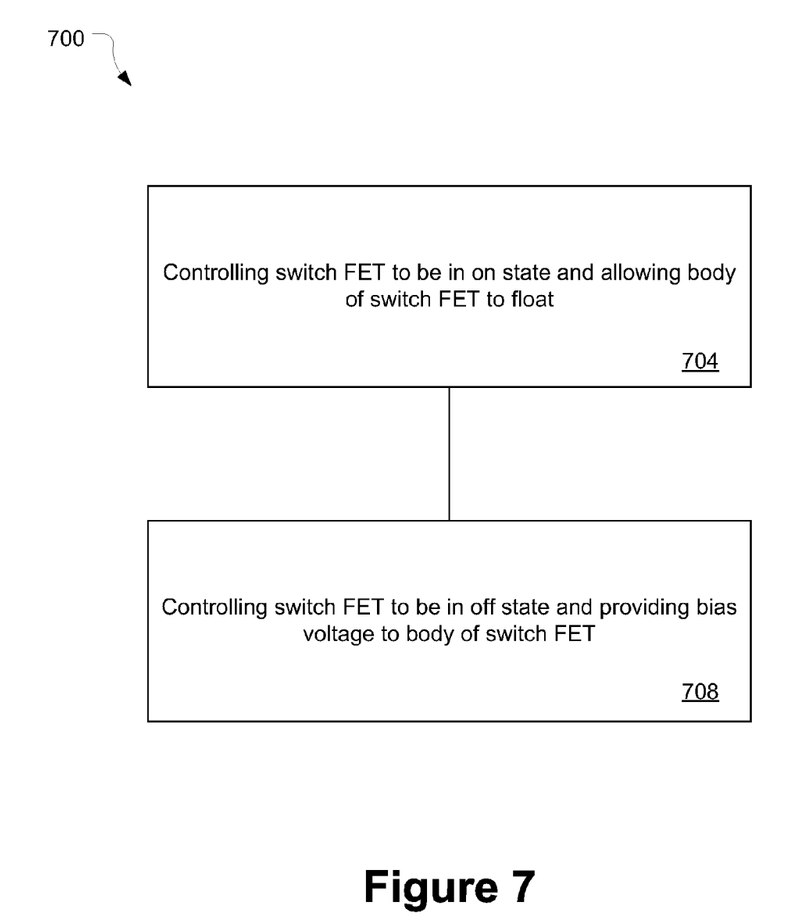
FIG. 7 illustrates a flowchart of a method of operation in accordance with some embodiments.

FIG. 7 shows a flowchart of a method 700 of operating a unit cell, for example, cell 100, 300, 500, or 600, in accordance with some embodiments.

At block 704, the method 700 may include controlling switch FET to be in on state. This may be done, for example, by a decoder providing a positive gate-to-source voltage on the switch FET. The method 700 may further include, at block 704, allowing a body of the switch FET to float, which may be approximately 0 V. This may be done, for example, by a coupling configuration of the body-bias circuit with respect to the drain, source, and body terminals of the switch FET such as those shown and described with respect to FIG. 1, 3, 5, or 6.

At block 708, the method 700 may include controlling switch FET to be in an off state. This may be done, for example, by the decoder providing a negative gate-to-source voltage on the switch FET. The method 700 may further include, at block 708, providing a bias voltage to the body of the switch FET. As described above, this may be done by the body-bias circuit deriving the body-bias voltage from the RF signal applied to the switch FET. In some embodiments, the body-bias voltage may be a negative bias voltage.

Figure 8:
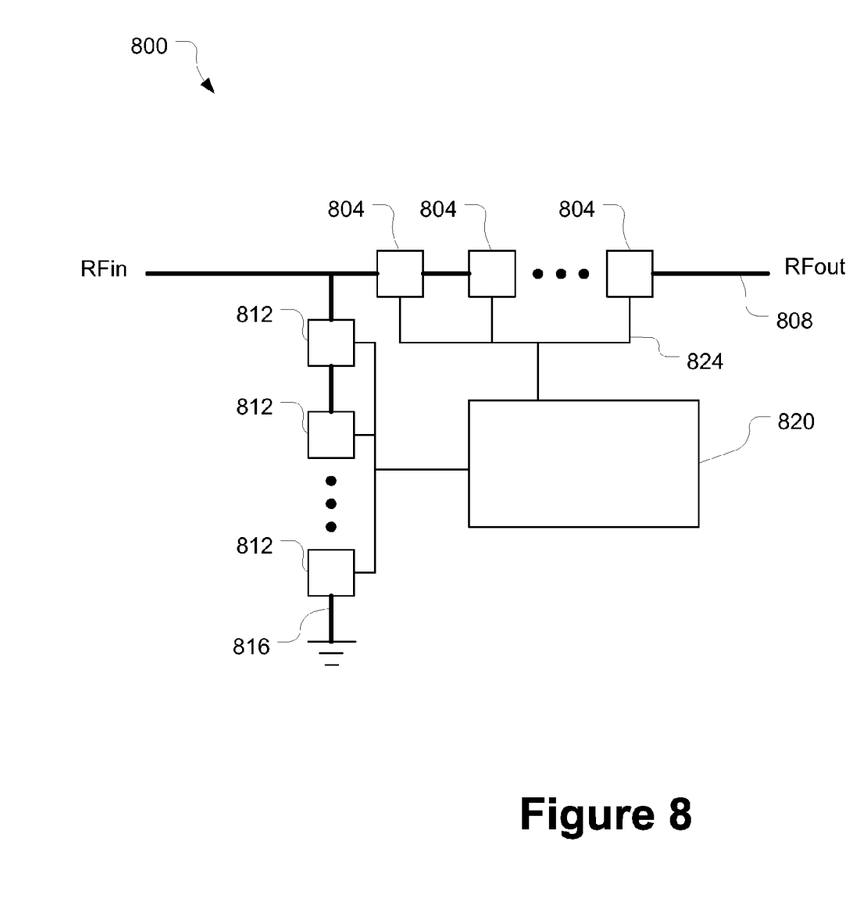
FIG. 8 illustrates a switching device in accordance with some embodiments.

FIG. 8 depicts an example of a switch device 800 in accordance with some embodiments. The switch device 800 may include a plurality of series cells 804 coupled in series with one another on a series line 808. The switch device 800 may further include a plurality of shunt cells 812 coupled in series with one another on a shunt line 816. It may be desirable to couple many cells in series as shown because, as noted above, when the switch FET is in the off state a large resistance is created between the source terminal and the drain terminal. If the current of the RF signal is very large, then the switch FET may be damaged. By coupling a plurality of FETs in series, the load created by the large RF signal may be distributed so that each FET is only bearing a portion of the load. In this manner, the lifetime of the FETs may be extended. Individual cells of the switch device 800 may be similar to cells 100, 300, 500, or 600.

The switch device 800 may further include a decoder 820. The decoder 820 may be coupled with the cells through decoder lines 824 (shown with lighter line-weight than the series line 808 and shunt line 816). In particular, a decoder line 824 may be provided to a gate terminal of each cell. Given that the body-bias circuits of the series cells 804 and the shunt cells 812 use the RF signal to derive an appropriate body bias voltage, the cells do not need a decoder line coupled with their body terminals. This reduction of control lines may result in a smaller die size, less substrate noise coupling, and a decrease in spurious signals entering an RF switch core from any on-die charge pump circuitry.

When the switch device 800 is in an on state, to pass the RF signal from an input to an output, the decoder 820 may set each of the series cells 804 to an on state and may set each of the shunt cells 812 to an off state. When the switch device 800 is in an off state, to prevent passage of the RF signal from the input to the output, the decoder 820 may set each of the series cells 804 to an off state and may set each of the shunt cells 812 to an on state.

Figure 9:
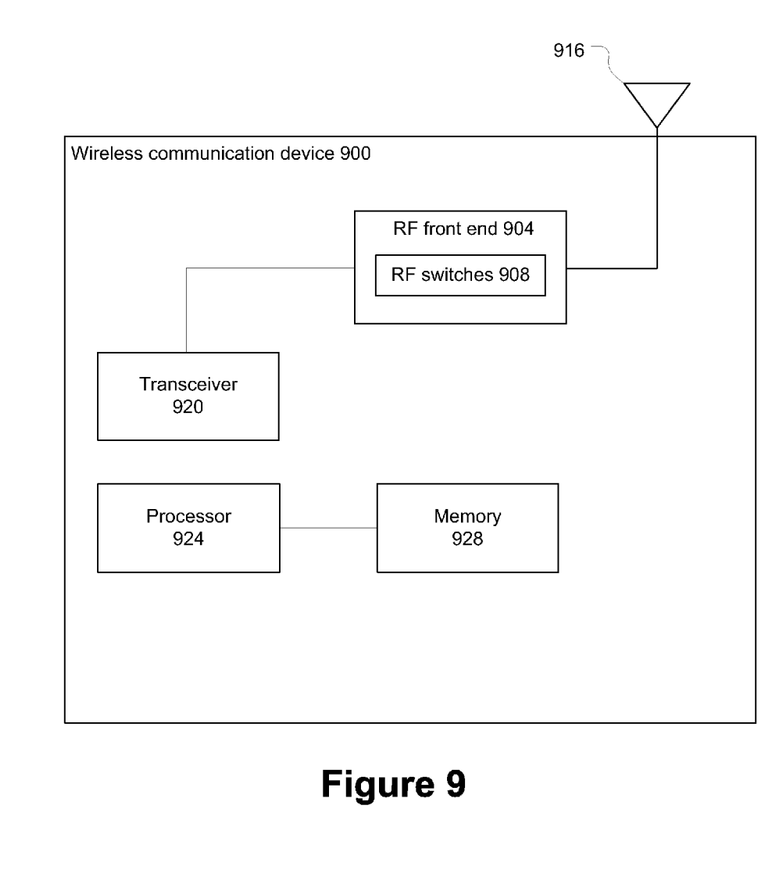
FIG. 9 illustrates a wireless communication device in accordance with some embodiments.

A wireless communication device 900 is illustrated in FIG. 9 in accordance with some embodiments. Wireless communication device 900 may have an RF front end 904 including one or more RF switches 908. The RF switches 908 may be similar to and substantially interchangeable with switch device 800. The RF switches 908 may be deployed in various elements of the RF front end 904 such as, but not limited to, an antenna switch module, a distribution switch, a transmitter, a receiver, etc. The RF front end 904 may also include other elements not specifically shown or discussed such as, but not limited to, amplifiers, converters, filters, etc.

In addition to the RF front end 904, the wireless communication device 900 may have an antenna structure 916, a transceiver 920, a processor 924, and a memory 928 coupled with each other at least as shown.

The processor 924 may execute a basic operating system program, stored in the memory 928, in order to control the overall operation of the wireless communication device 900. For example, the main processor 924 may control the reception of signals and the transmission of signals by transceiver 920. The main processor 924 may be capable of executing other processes and programs resident in the memory 928 and may move data into or out of memory 928, as desired by an executing process.

The transceiver 920 may receive outgoing data (e.g., voice data, web data, e-mail, signaling data, etc.) from the processor 924, may generate RF signal(s) to represent the outgoing data, and provide the $RF_{in}$ signal(s) to the RF front end 904. Conversely, the transceiver 920 may receive RF signals from the RF front end 904 that represent incoming data. The transceiver 920 may process the RF signals and send incoming signals to the processor 924 for further processing.

The RF front end 904 may provide various front-end functionality. The front-end functionality includes, but is not limited to, switching provided by the RF switches 908. In particular, the RF switches 908 may selectively pass RF signal(s) to, from, or within components of wireless communication device 900.

In various embodiments, the wireless communication device 900 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

Those skilled in the art will recognize that the wireless communication device 900 is given by way of example and that, for simplicity and clarity, only so much of the construction and operation of the wireless communication device 900 as is necessary for an understanding of the embodiments is shown and described. Various embodiments contemplate any suitable component or combination of components performing any suitable tasks in association with wireless communication device 900, according to particular needs. Moreover, it is understood that the wireless communication device 900 should not be construed to limit the types of devices in which embodiments may be implemented.

Various embodiments describe a circuit configured to switch radio-frequency ("RF") signals, the circuit comprising: a FET including a source terminal, a gate terminal, a drain terminal, and a body terminal; and a body-bias circuit coupled with the source terminal, the drain terminal and the body terminal, the body-bias circuit configured to: derive a negative bias voltage based on an RF signal applied to the FET; and provide the negative bias voltage to the body terminal when the FET is in an off state.

The circuit may include a plurality of FETs, including the FET (e.g., an n-type FET), coupled in series with one another.

The body-bias circuit may only be coupled with the source terminal, the drain terminal, and the body terminal.

The circuit may be an SOI circuit.

Where the FET is a first FET, the body-bias circuit may include a node coupled with the body terminal; a second FET having: a source terminal coupled with the source terminal of the first FET; and a drain terminal coupled with the node; and a third FET having: a drain terminal coupled with the node; and a source terminal coupled with the drain terminal of the first FET.

The second FET may further include a gate terminal coupled with the drain terminal of the first FET; and the third FET may further include a gate terminal coupled with the source terminal of the first FET.

The first and second FETs may be diode-connected FETs; the second FET further may further include a gate terminal coupled with the node; and the third FET may further include a gate terminal coupled with the node.

The body-bias circuit may include a node coupled with the body terminal; a first diode coupled with the source terminal and the node; and a second diode coupled with the drain terminal and the node.

The first diode may include a cathode terminal coupled with the source terminal and an anode terminal coupled with the node; and the second diode includes a cathode terminal coupled with the drain terminal and an anode terminal coupled with the node.

The body-bias circuit may derive the negative bias voltage by rectifying the RF signal.

Some embodiments describe a wireless communication device comprising: a transceiver; an antenna; and a radio frequency ("RF") front-end coupled with the transceiver and the antenna and configured to communicate signals between the transceiver and the antenna, the radio frequency front-end including a silicon-on-insulator switching device that has: a decoder configured to set a plurality of switch FETs in an off state or an on state; and a cell with a first FET of the plurality of FETs and a body-bias circuit, wherein the body-bias circuit is configured to provide a negative voltage to a body of the field-effect transistor when the first FET is in an off-state, the negative voltage derived from an RF signal applied to the first FET.

The body-bias circuit may include a node coupled with a body terminal of the first FET; a second FET having: a source terminal coupled with a source terminal of the first FET; and a drain terminal coupled with the node; and a third FET having: a drain terminal coupled with the node; and a source terminal coupled with the drain terminal of the first FET.

The second FET may further include a gate terminal coupled with the drain terminal of the first FET; and the third FET may further include a gate terminal coupled with the source terminal of the first FET.

Some embodiments may include a method comprising: controlling, with a decoder circuit, a switch field-effect transistor ("FET") to be in an off state; deriving, with a body-bias circuit, a negative bias voltage based on a RF signal applied to the switch FET while the switch FET is in the off state; and providing, by the body-bias circuit, the negative bias voltage to a body of the switch FET while the switch FET is in the off state.

Deriving the negative bias voltage may include rectifying the RF signal applied to the switch FET.

Some embodiments describe a circuit configured to switch RF signals, the circuit comprising: a FET including a source terminal, a gate terminal, a drain terminal, and a body terminal; and a body-bias circuit having: a node coupled with the body terminal; a first resistor coupled with the drain terminal and the node; and a second resistor coupled with the source terminal and the node, wherein the body-bias circuit is configured to: derive a bias voltage based on an RF signal applied to the FET; and provide the bias voltage to the body terminal.

The first resistor and the second resistor may be of equal size.

The body-bias circuit may be configured to provide the bias voltage as a DC voltage of approximately zero volts.

The gate terminal of the FET may be coupled with a decoder; and the drain terminal of the FET is not coupled with the decoder.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit configured to switch radio-frequency ("RF") signals, the circuit comprising:
   a field-effect transistor ("FET") including a source terminal, a gate terminal, a drain terminal, and a body terminal; and
   a body-bias circuit coupled with the source terminal, the drain terminal and the body terminal, the body-bias circuit having a first circuit element coupled between the source terminal and the body terminal and a second circuit element coupled between the drain terminal and the body terminal, the first and second circuit elements to:
   derive a negative bias voltage based on an RF signal through the first and second circuit elements; and
   provide the negative bias voltage to the body terminal when the FET is in an off state.

2. The circuit of claim 1, further comprising:
   a plurality of FETs, including the FET, coupled in series with one another.

3. The circuit of claim 1, wherein the FET is an n-type FET.

4. The circuit of claim 1, wherein the body-bias circuit is only coupled with the source terminal, the drain terminal, and the body terminal.

5. The circuit of claim 1, wherein the circuit comprises a silicon-on-insulator ("SOI") circuit.

6. The circuit of claim 1, wherein the FET is a first FET and the body-bias circuit comprises:
   a node coupled with the body terminal,
   wherein:
      the first circuit element includes a second FET having:
         a source terminal coupled with the source terminal of the first FET; and
         a drain terminal coupled with the node; and
      the second circuit element includes a third FET having:
         a drain terminal coupled with the node; and
         a source terminal coupled with the drain terminal of the first FET.

7. The circuit of claim 6, wherein:
   the second FET further includes a gate terminal coupled with the drain terminal of the first FET; and
   the third FET further includes a gate terminal coupled with the source terminal of the first FET.

8. The circuit of claim 6, wherein the first and second FETs are diode-connected FETs and:
   the second FET further includes a gate terminal coupled with the node; and
   the third FET further includes a gate terminal coupled with the node.

9. The circuit of claim 1, wherein the body-bias circuit comprises:
   a node coupled with the body terminal,
   wherein:
      the first circuit element includes a first diode coupled with the source terminal and the node; and
      the second circuit element includes a second diode coupled with the drain terminal and the node.

10. The circuit of claim 9, wherein:
   the first diode includes a cathode terminal coupled with the source terminal and an anode terminal coupled with the node; and
   the second diode includes a cathode terminal coupled with the drain terminal and an anode terminal coupled with the node.

11. The circuit of claim 1, wherein the body-bias circuit is to derive the negative bias voltage by being configured to rectify the RF signal.

12. A wireless communication device comprising:
   a transceiver;
   an antenna; and
   a radio frequency ("RF") front-end coupled with the transceiver and the antenna and configured to communicate signals between the transceiver and the antenna, the radio frequency front-end including a silicon-on-insulator switching device that has:
  a decoder configured to set a plurality of switch field-effect transistors ("FET") in an off state or an on state; and
  a cell with a field-effect transistor ("FET") of the plurality of FETs and a body-bias circuit, wherein the body-bias circuit includes first and second circuit elements to provide a negative voltage to a body of the field-effect transistor when the FET is in an off-state, the negative voltage derived from an RF signal through the first and second circuit elements.

13. The wireless communication device of claim 12, wherein the FET is a first FET and the body-bias circuit comprises:
  a node coupled with a body terminal of the first FET, wherein:
    the first circuit element includes a second FET having: a source terminal coupled with a source terminal of the first FET; and a drain terminal coupled with the node; and
    the second circuit element includes a third FET having: a drain terminal coupled with the node; and a source terminal coupled with the drain terminal of the first FET.

14. The wireless communication device of claim 13, wherein:
  the second FET further includes a gate terminal coupled with the drain terminal of the first FET; and
  the third FET further includes a gate terminal coupled with the source terminal of the first FET.

15. A method comprising:
  controlling, with a decoder circuit, a switch field-effect transistor ("FET") to be in an off state;
  deriving, with a body-bias circuit, a negative bias voltage based on a radio-frequency ("RF") signal through first and second circuit elements of the body-bias circuit while the switch FET is in the off state; and
  providing, by the body-bias circuit, the negative bias voltage to a body of the switch FET while the switch FET is in the off state.

16. The method of claim 15, wherein deriving the negative bias voltage comprises:
  rectifying the RF signal applied to the switch FET.

17. A circuit configured to switch radio-frequency ("RF") signals, the circuit comprising:
  a field-effect transistor ("FET") including a source terminal, a gate terminal, a drain terminal, and a body terminal; and
  a body-bias circuit having:
    a node coupled with the body terminal;
    a first resistor coupled with the drain terminal and the node; and
    a second resistor coupled with the source terminal and the node,
  wherein the body-bias circuit is configured to:
    derive a bias voltage based on an RF signal through the first and second resistors; and
    provide the bias voltage to the body terminal.

18. The circuit of claim 17, wherein the first resistor and the second resistor are of equal size.

19. The circuit of claim 17, wherein the body-bias circuit is configured to provide the bias voltage as a DC voltage of approximately zero volts.

20. The circuit of claim 17, wherein the gate terminal of the FET is coupled with a decoder; and the drain terminal of the FET is not coupled with the decoder.

* * * * *